US005337021A

United States Patent [19]

Zarabadi et al.

[11] Patent Number: 5,337,021

[45] Date of Patent: Aug. 9, 1994

[54] HIGH DENSITY INTEGRATED CIRCUIT WITH HIGH OUTPUT IMPEDANCE

[75] Inventors: Seyed R. Zarabadi, Kokomo, Ind.; Mohammed Ismail, Columbus, Ohio

[73] Assignee: Delco Electronics Corp., Kokomo, Ind.

[21] Appl. No.: 75,941

[22] Filed: Jun. 14, 1993

[51] Int. Cl.[5] .......................... H03F 1/56; H03F 3/45; H03F 1/22

[52] U.S. Cl. .................................... 330/288; 330/292; 330/300

[58] Field of Search ............... 330/288, 292, 300, 311, 330/307

[56] References Cited

U.S. PATENT DOCUMENTS 5,245,273 9/1993 Greaves et al. ..................... 307/260
5,254,880 10/1993 Horiguchi et al. ................... 328/59

OTHER PUBLICATIONS

Klaas Bult and Covert J. G. M. Gleen, "The CMOS Gain-Boosting Technique", Analog Integrated Circuits and Signal Processing 1, pp. 119–135, Kluwer Academic Publishers, Boston, Mass., 1991.

*Primary Examiner*—William L. Sikes
*Assistant Examiner*—Fetsum Abraham
*Attorney, Agent, or Firm*—Jimmy L. Funke

[57] ABSTRACT

A circuit apparatus suitable for use as a basic building block of very small geometry integrated circuits (on the order of 1 micron and smaller) comprising (i) a current mirror circuit with a cascode output, comprising a first transistor and a second transistor connected in series, the first transistor coupled between a ground and the second transistor, and (ii) a single stage gain loop comprising a transresistance amplifier coupled between a control input of the second transistor and the series connection of the first and second transistors, wherein the circuit apparatus provides an output with high impedance output and with maximum swing capability.

15 Claims, 1 Drawing Sheet

HIGH DENSITY INTEGRATED CIRCUIT WITH HIGH OUTPUT IMPEDANCE

This invention relates to high density integrated circuitry, and more particularly to a very high impedance circuit suitable as a cascode current source, current mirror, transresistance stage amplifier with maximum output swing capability.

BACKGROUND OF THE INVENTION

High performance MOS and bipolar analog circuits are necessary for enhancing the performance of very low scale integrated subsystems. For instance, the common-mode rejection, supply rejection, and DC gain of an operational amplifier and other analog circuits are strongly dependent upon the quality of the current sources/transresistance stages that are incorporated in their designs.

Short-channel length MOS devices exhibit a pronounced degradation in output conductance compared with that of long-channel length devices. This becomes even more severe for high speed designs in which the drain current is usually large. The output impedance expression for an MOS device is defined by:

$$r_{ds}=1/g_{ds}=1/(\lambda I_d)=L_{eff}/\{I_d[d(L-L_{eff})/dV_{ds}]\}, \quad (1)$$

where $r_{ds}$ is the output impedance, $L_{eff}$ is the effective channel length, $I_d$ is the drain current, L is the drawn channel length, $V_{ds}$ is the drain-to-source voltage and $g_{ds}$ is the drain-to-source conductance. Since small effective channel lengths, $L_{eff}$, and large drain currents, $I_d$, are chosen for fast operations, and short-channel length devices display large values for $d(L-L_{eff})/dV_{ds}$, therefore the output impedance, $r_{ds}$, of an MOS device with a small channel length is significantly smaller than that with large channel length. This can indeed pose a serious problem while designing very high speed and high performance analog circuits.

The degradation of output impedance of MOS devices is prevalent in integrated systems with gate lengths on the order of 2 micron and smaller. In MOS devices with gate lengths as small as 1 micron, many traditional building block circuits fail to function properly because of the low output impedance of the basic transistor.

SUMMARY OF THE PRESENT INVENTION

Advantageously, this invention provides a reconfigurable CMOS/BiCMOS cascode current source/current mirror/transresistance stage with very high output impedance. Advantageously this invention provides a very high performance and versatile circuit that significantly improves the performance of very high density analog integrated circuits. Advantageously, the circuit of this invention can be reconfigured to function as a high quality current source, current mirror, or tranresistance stage amplifier with very high output impedance, even when integrated into very high density circuits.

Advantageously, the apparatus of this invention provides a fundamental building block for use in the design of CMOS/BiCMOS analog circuits in scaled technologies. Advantageously the circuit of this invention provides improved output impedance, output swing capability and bandwidth.

Advantageously, this invention achieves such a high output impedance that it approaches the high leakage resistance of a reverse biased Junction while having maximum output swing capability. Advantageously, this invention provides a circuit with an output Thevinin voltage greater than $10^8$ V.

Advantageously, for scaled technologies, the circuit of this invention is ideal for practical high performance analog circuit design. Advantageously, the circuit of this invention suitable for usage in the output stage of high performance amplifiers, which exhibit very high gain-bandwidth product and have maximum output swing capability.

The advantageous structure of this invention comprises: (i) a current mirror circuit with a cascode output, comprising two transistors in series, the first transistor coupled between circuit ground and the second transistor, (ii) a single stage gain loop comprising a transresistance amplifier coupled between a control input of the second transistor and the connection of the first and second transistors, and (iii) a saturation compensation circuit, coupled across the first transistor, comprising means, responsive to current through the first transistor, for maintaining the first transistor in saturation.

A more detailed description of this invention, along with its operation is set forth in the detailed description below.

DETAILED DESCRIPTION OF THE INVENTION

EXAMPLE 1

Figure 1:
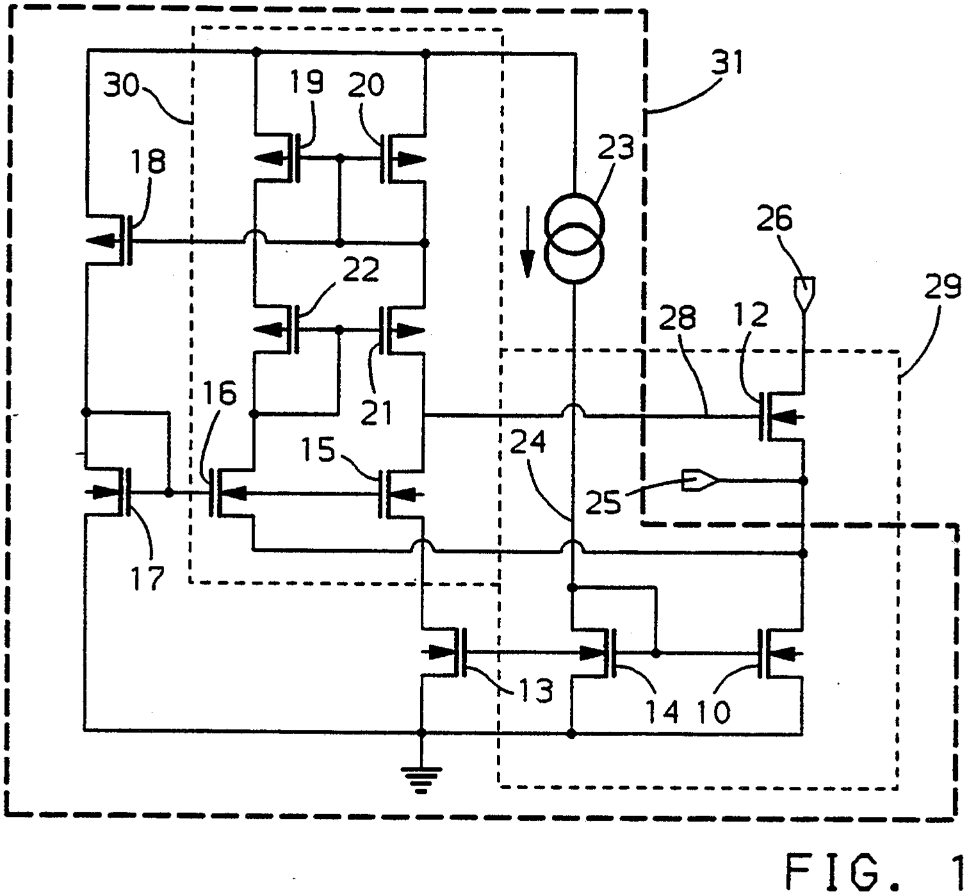
FIG. 1 illustrates MOS circuit implementation of this invention.

Referring to FIG. 1, the circuit of this invention shown comprises seven NMOS transistors 10, 12, 13, 14, 15, 16 and 17 and five PMOS transistors 18, 19, 20, 21 and 22. The physical size of the PMOS transistors can be chosen equal, and the same can be exercised for the NMOS transistors with the exception that transistor 10 should have twice the size of transistors 12–16 and transistor 17 should have one-fourth the size of transistors 12–16.

The circuit apparatus according to this invention comprises three component circuits 29, 30 and 31 that function together to achieve the apparatus of this invention. The first component circuit 29 is a current mirror comprising transistors 10, 12 and 14. In general, current mirror 29 functions in a typical manner, current provided by current reference 23 is mirrored from transistor 14 to transistor 10, which forces the current through cascoded transistor 12 to output line 26. Current reference 23 may be replaced by an input current provided by another source.

If the circuit comprised simply transistors 10, 12 and 14 and current source 23, in high density implementations, the output impedance would shrink as low as 1K, rendering the circuit effectively useless. As explained below, the output impedance of the circuit of this invention approaches infinity, even in high density applications with gate lengths on the order of one micron.

The second component circuit 30 is a single stage amplifier coupled between the gate (control input) of transistor 12 and node 27 connecting transistors 10 and 12. Single stage amplifier 30 is a high gain amplifier comprising transistors 15, 16, 19, 20, 21 and 22. The high gain of single stage amplifier 30 operates to maintain the gate of transistor 12 at a constant voltage, forcing a high output impedance across transistor 12, as explained in more detail below.

In operation, the current mirror 29 and single stage amplifier 30 together provide a suitable current source with high output impedance.

Current mirror 29 and single stage amplifier 30 also provide a current to voltage converter or transimpedance amplifier with a high output impedance. If a current input is provided on line 25, that current is forced through transistor 16, since current through transistor 10 is held constant by current mirror transistor 14. Transistors 15, 16, 19, 20 and 21 convert the current forced through transistor 16 to a voltage, with a high gain, provided to the gate of transistor 12. The high voltage at the gate of transistor 12 in turn forces a voltage output on line 26 proportional to the current input on line 25. The voltage change at the gate of transistor 12 maintains the high output impedance across transistor 12.

More particularly, the circuit maintains a very high output impedance by keeping the drain voltage of the transistor 10 constant for any allowed signal variation in the circuit. For instance, by changing the input current, Iin, supplied by current source 23, the gate voltage of transistor 14 changes accordingly. This change is transferred to the drain of transistor 10, which change is in turn sensed by the source terminal of transistor 16 and its cascode load transistors 19 and 22. This change is then amplified and inverted by transistors 20 and 21 and appears at the gate and subsequently at the source of transistor 12, which counter balances the initial change with great precision.

The current source 23 (providing current Iref|Iin) is the input and Iout on line 26 is the output current when the circuit is used as a current source/current mirror, whereas a current Iins provided into line 25 becomes the input and a voltage Vout generated on line 26 becomes the output when functioning as a transresistance stage. Assuming that the tramsconductance of a transistor ($g_m$) is much larger than its output conductance ($g_o=1/r_{ds}$), the small signal output resistance of the circuit functioning as a current source is:

$$r_{o,1}=r_{ds10}+r_{ds12}+r_{ds10}r_{ds12}(g_{m12}g_{mb12})[1+r_{ds22}(g_{m22}g_{mb22})+r_{ds16}r_{ds22}(g_{m16}+g_{mb12})(g_{m22}+g_{mb22})] \text{ and } r_{ds10}r_{ds12}r_{ds16}r_{ds22}(g_{m12}+g_{mb12})(g_{m16}+g_{mb16})(g_{m22}+g_{mb22}) \tag{2}$$

where $r_{dsi}$ is the output resistance, $g_{mi}$ is the transconductance and $g_{mbi}$ is the body transconductance of the ith transistor.

It is evident from equation (2) that extremely high output impedance circuits can be obtained according to this invention. The high output impedance feature can improve the DC gain, common-mode rejection and supply rejection of amplifiers.

When Iins, line 25, is the input and Vout, line 26, is the output, and assuming $g_m>>g_o=1/r_{ds}$ and $R_{L,is}$ the load impedance, the small signal DC transfer function of the transresistance circuit is:

$$Vout/Iins = R_L(1/r_{ds10} + g_{m12} + g_{mb12} + r_{ds22}(g_{m12} + g_{mb12})(g_{m22} + g_{mb22}) + r_{ds16}r_{ds22}(g_{m12} + g_{mb12})(g_{m16} + g_{mb16})(g_{m22} + g_{mb22}) / [1/r_{ds10} + \tag{3}$$

-continued $$1/r_{ds12} + 1/r_{ds16} + R_L/(r_{ds10}r_{ds12}) + R_L/(r_{ds12}r_{ds16}) + g_{m12} + g_{mb12} + g_{m16} + g_{mb16} + r_{ds22}(g_{m12} + g_{mb12})(g_{m22} + g_{mb22}) + r_{ds16}r_{ds22}(g_{m12} + g_{mb12})(g_{m16} + g_{mb16})(g_{m22} + g_{mb22})]$$

$$\cong R_L r_{ds16}r_{ds22}(g_{m12} + g_{mb12})(g_{m16} + g_{mb16})(g_{m22} + g_{mb22}) / [R_L/(r_{ds10}r_{ds12}) + R_L/(r_{ds12}r_{ds16}) + r_{ds16}r_{ds22}(g_{m12} + g_{mb12})(g_{m16} + g_{mb16})(g_{m22} + g_{mb22})] \tag{4}$$

Assuming that the currents in each of transistor 15–17 are equal and are one-half of the current flowing in transistor 10, then by choosing the size of transistor 17 one-fourth that of transistor 16, the static drain voltage of transistor 10 is Just equal to its own voltage $V_{GS10}-V_{T10}$. Due to the negative feedback in the loop containing transistors 10, 12, 15, 16 and 19–20 the drain voltage of transistor 10 is forced to be constant, which maintains a very high output resistance in the circuit.

The third component circuit 31 includes transistors 6–12 and comprises a compensation circuit that functions to keep transistor 10 in saturation. In general, when transistor 10 is kept in saturation, it is desirable to keep the drain-to-source saturation voltage to its minimum allowable value. Assuming the output swing on line 26 is the rail-to-rail voltage minus the voltage drops across transistors 10 and 12, it is desirable to maintain transistor 10 in saturation to allow a maximum swing of the output voltage on line 26.

The saturation voltage of transistor 10 varies with current through transistor 10, causing the output swing of line 26 also to degrade. Thus, compensation circuit 31 compensates for variations in current through transistor 10, maintaining transistor 10 in saturation, thereby maximizing the output swing on line 26.

Compensation circuit 31 works as follows. Transistor 13 mirrors the current through transistors 10 and 14 and forces the mirrored current through cascoded transistors 15, 20 and 21. The current through transistor 20 is mirrored through transistors 18 and 19. The current in transistor 18 is forced through transistor 17, in turn forcing the voltage at the gates of transistors 16 and 17 to vary with the current through transistor 17. This affects the voltage across transistor 16, which, in turn affects the voltage across transistor 10, in relation to the current through transistor 10 to thereby compensate for variations in the saturation voltage of transistor 10 due to the level of current flow through transistor 10.

EXAMPLE 2

Figure 2:
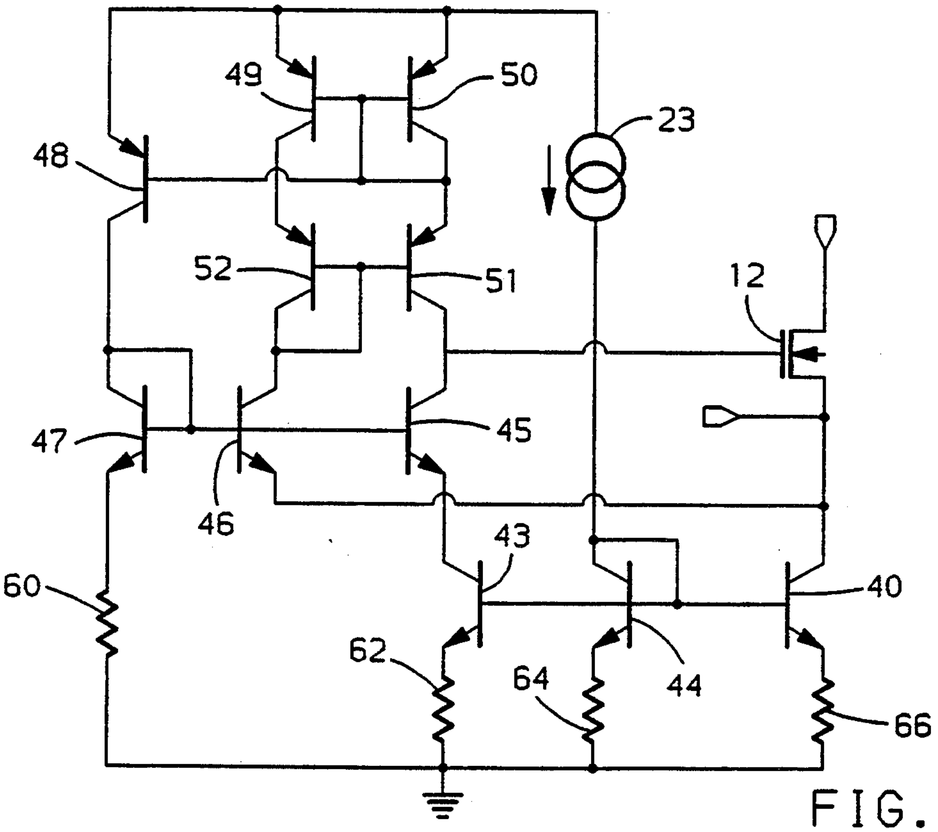
FIG. 2 illustrates a BiCMOS circuit implementation of this invention.

A BiCMOS version of the circuit of this invention is shown in FIG. 2 comprising NPN transistors 40 and 45–47, NMOS transistor 12, and PNP transistors 48–52. The emitter degeneration resistors 60–66 provide temperature stability. The resistances of resistors 62, 64 and 66 are equal and the resistance of resistor 60 relative to that in resistors 62–66 are chosen such that transistor 40 is assured to operate in its active region while permitting maximum output swing.

More particularly, assuming I is the emitter current of transistor 47, then for proper operation, the relationship between the resistances should be $R_{60}>2R_{62}+V_{CEsatQ40}/I$.

The BiCMOS version is recommended when the performance of bipolar transistors can exceed that of MOS devices. Using high quality bipolar transistors, the circuit in FIG. 2 will outperform its CMOS counter-part. This is due to the high transconductance and output resistance of bipolar transistors, which tend to assist the collector voltage of transistor 40 to stay constant with even high precision (due to higher loop gain and bandwidth in the cascode feedback circuit).

The above described circuit of this invention is useful as a basic building block for very small geometry integrated circuits, which are currently implemented on the order of one micron per gate length. Such circuits typically operated at voltage levels on the order of 3.3 volts, which necessitates the high output impedance requirement. Example basic building block implementations of the circuit of this invention include a current source with practically infinite output impedance, an output stage of a high speed, high gain operational amplifier, a current mirror and a current to voltage converter.

The above described implementations of this invention are example implementations and are not limiting on the scope of this invention. Moreover, various other implementations, improvements and modifications of this invention may occur to those skilled in the art and such implementations, improvements and modifications will fall within the scope of this invention as set forth below.

The embodiments of the invention in which an exclusive property or privilege is claimed are defined as follows:

1. A circuit apparatus comprising:

(i) a current mirror circuit with a cascode output, comprising a first transistor and a second transistor connected in series, the first transistor coupled between a ground and the second transistor;

(ii) a single stage gain loop comprising a transresistance amplifier coupled between a control input of the second transistor and the series connection of the first and second transistors; and (iii) a saturation compensation circuit coupled across the first transistor and comprising means, responsive to a current through the first transistor, for maintaining the first transistor in saturation, wherein the circuit apparatus provides an output with high impedance and is suitable for integration on a very small scale.

2. The circuit apparatus of claim 1 wherein the circuit apparatus comprises at least part of a current mirror.

3. The circuit apparatus of claim 1, wherein the circuit apparatus comprises at least part of an operational amplifier.

4. The circuit apparatus of claim 1, wherein the circuit apparatus comprises at least part of a current source with a high output impedance.

5. The circuit apparatus of claim 1, wherein the circuit apparatus comprises at least part of a current-to-voltage converter.

6. The circuit apparatus of claim 1, wherein the first transistor is an MOS transistor.

7. The circuit apparatus of claim 1, wherein the first transistor is a BiCMOS transistor.

8. The circuit apparatus of claim 1, wherein the current mirror circuit comprises a source of sourced electric current connected in series with a third transistor, wherein the third transistor is coupled to the first transistor to mirror the sourced electric in the first transistor, wherein the current draw of the second transistor is equal to the sourced electric current and wherein the second transistor has a high output impedance.

9. The circuit of claim 1, wherein the transresistance amplifier comprises fourth, fifth and sixth transistors connected in series between a voltage supply line and the connection between the first and second transistors, and comprises seventh, eighth, ninth and tenth transistors coupled in series between the voltage supply line and the ground, wherein the sixth and tenth transistors are coupled together causing the sixth transistor to mirror current in the tenth transistor, wherein the fifth and ninth transistors are coupled together causing the ninth transistor to mirror current in the fifth transistor, and wherein the control input of the second transistor is coupled to a connection between the eighth and ninth transistors.

10. The circuit apparatus of claim 9, wherein the saturation compensation circuit comprises the transresistance amplifier and eleventh and twelfth transistors, wherein the eleventh transistor is coupled to the fifth transistor so that current through the fifth transistor is mirrored through the eleventh transistor, the twelfth transistor connected in series with the eleventh transistor and coupled to the fourth transistor to affect a fourth transistor voltage drop across the fourth transistor and to resultantly affect a first transistor voltage drop across the first transistor.

11. The circuit apparatus of claim 1 integrated on a scale having gate lengths one micron or smaller.

12. A circuit apparatus comprising first, second and third component circuits, the first component circuit having current mirror configuration comprising first and second transistors connected in series with a cascode transistor output, the second component circuit comprising a transresistance amplifier connected between the series connection of the first and second transistors and a gate of the second transistor.

13. A circuit apparatus comprising:

(i) a current mirror circuit with a cascode output, comprising a first transistor and a second transistor connected in series, the first transistor coupled between a ground and the second transistor; and (ii) a single stage gain loop comprising a transresistance amplifier coupled between a control input of the second transistor and the series connection of the first and second transistors, wherein the circuit apparatus provides a high output impedance and is suitable for integration with very small device geometry.

14. The circuit apparatus of claim 13, also comprising (iii) a saturation compensation circuit coupled across the first transistor and comprising means, responsive to a current through the first transistor, for maintaining the first transistor in saturation, wherein the circuit apparatus provides an output with maximum swing capability.

15. The circuit apparatus of claim 13 integrated on a scale having gate lengths one micron or smaller.

* * * * *